(12) United States Patent
Lee et al.

(10) Patent No.: US 11,487,208 B2
(45) Date of Patent: Nov. 1, 2022

(54) PROCESS LIQUID FOR EXTREME ULTRAVIOLET LITHOGRAPHY AND PATTERN FORMING METHOD USING SAME

(71) Applicant: YOUNG CHANG CHEMICAL CO., LTD, Gyeongsangbukdo (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 0 days.

(21) Appl. No.: 17/294,865

(22) PCT Filed: Nov. 11, 2019

(86) PCT No.: PCT/KR2019/015262
§ 371 (c)(1),
(2) Date: May 18, 2021

(87) PCT Pub. No.: WO2020/138710
PCT Pub. Date: Jul. 2, 2020

(65) Prior Publication Data
US 2022/0011673 A1    Jan. 13, 2022

(30) Foreign Application Priority Data

Dec. 28, 2018  (KR) .................. 10-2018-0171750

(51) Int. Cl.
*G03F 7/20*    (2006.01)
*G03F 7/32*    (2006.01)
*H01L 21/02*   (2006.01)
*H01L 21/027*  (2006.01)

(52) U.S. Cl.
CPC .......... *G03F 7/322* (2013.01); *G03F 7/70033* (2013.01); *H01L 21/0206* (2013.01); *H01L 21/0274* (2013.01)

(58) Field of Classification Search
CPC ...... G03F 7/322; G03F 7/70033; G03F 7/405; H01L 21/0206; H01L 21/0274
See application file for complete search history.

(56) References Cited

U.S. PATENT DOCUMENTS

2019/0033718 A1*  1/2019  Kamimura .............. G03F 7/425

FOREIGN PATENT DOCUMENTS

| CN | 102929109 A     | 2/2013  |
| KR | 10-2008-0009970 A | 1/2008  |
| KR | 10-2009-0017129 A | 2/2009  |
| KR | 10-2009-0095604 A | 9/2009  |
| KR | 10-2013-0123164 A | 11/2013 |
| KR | 10-2011879 B1   | 8/2019  |
| WO | 2017-169834 A1  | 10/2017 |

\* cited by examiner

*Primary Examiner* — Mesfin T Asfaw
(74) *Attorney, Agent, or Firm* — Novick, Kim & Lee PLLC; Jae Youn Kim

(57) ABSTRACT

Proposed are a processing solution for reducing the incidence of pattern collapse and the number of defects in a photoresist pattern including polyhydroxystyrene using extreme ultraviolet rays as an exposure source, and a method of forming a pattern using the same. The processing solution for reducing the incidence of photoresist pattern collapse and the number of defects includes 0.0001 to 1 wt % of an alkaline material, 0.0001 to 1 wt % of an anionic surfactant, and 98 to 99.9998 wt % of water.

14 Claims, No Drawings

PROCESS LIQUID FOR EXTREME ULTRAVIOLET LITHOGRAPHY AND PATTERN FORMING METHOD USING SAME

TECHNICAL FIELD

The present disclosure relates to a processing solution for reducing the incidence of pattern collapse and the number of defects in a photoresist pattern including polyhydroxystyrene during photoresist patterning using extreme ultraviolet rays as a light source, and to a method of forming a photoresist pattern using the same.

BACKGROUND ART

In general, semiconductors are manufactured through a lithography process using, as an exposure source, ultraviolet rays in a wavelength band of 193 nm, 248 nm, 365 nm, or the like, and competition is fierce among individual companies to reduce the minimum line width (hereinafter, CD: critical dimension) thereof.

In order to form a finer pattern, a light source having a smaller wavelength band is required. Currently, lithography technology using extreme ultraviolet rays (EUV, having a wavelength of 13.5 nm) as a light source is actively used, and a finer wavelength may be realized using the same.

However, since improvements have still not been made to an etching resistance of a photoresist for extreme ultraviolet rays, a photoresist pattern having a large aspect ratio is constantly required, which easily leads to pattern collapse and increases the number of defects during development, so there is a problem in that the processing margin in the manufacturing process is greatly reduced.

Accordingly, it is required to develop techniques for reducing the incidence of pattern collapse and the number of defects during the formation of a fine pattern. In order to reduce the incidence of pattern collapse and the number of defects, it may be ideal to improve the performance of the photoresist, but the reality that it is difficult to develop a novel photoresist that satisfies all performance aspects cannot be ignored.

Aside from the need to develop novel photoresists, efforts to reduce the incidence of pattern collapse and the number of defects in other ways are ongoing.

DISCLOSURE

Technical Problem

An objective of the present disclosure is to provide a processing solution composition capable of reducing the incidence of pattern collapse and the number of defects after photoresist development in a fine patterning process using extreme ultraviolet rays, and a method of forming a photoresist pattern using the same.

Technical Solution

An aqueous processing solution used during the development process may include a variety of surfactants, but in the present disclosure, an effective processing solution may be prepared using an anionic surfactant.

In the case in which a nonionic surfactant that exhibits hydrophobicity is added to an aqueous processing solution, which mostly contains ultrapure water, hydrophobization of the photoresist wall is induced, making it possible to reduce melting and collapse of the pattern, but there is a likelihood that defects may form due to agglomeration of the nonionic surfactant during use thereof because the physical properties of the processing solution are nonuniform due to the strong tendency of the nonionic surfactant to agglomerate. When using a nonionic surfactant, the amount thereof has to be increased to improve melting, undesirably causing damage to the photoresist. In addition, in the case in which an excessive amount of an unsuitable surfactant is used for the purpose of lowering the surface tension of the processing solution in order to reduce the capillary force, it may cause melting of the pattern and further collapse of the pattern.

In addition, in the case of a cationic surfactant, an active group dissociates into a cation in an aqueous solution, making it difficult to protect a metal. This may be a factor causing serious defects in the photolithography process.

In the present disclosure, it is confirmed that the use of an anionic surfactant is very effective at reducing the incidence of pattern collapse and the number of defects. This is deemed to be because the hydrophilic group thereof is dissociated into an anion, unlike a nonionic surfactant, which does not react with the deprotected portion in the photoresist and reacts relatively easily with the positively charged portion, thus helping to form a fine pattern.

A representative developer that is currently used in most photolithography development processes is configured to include mainly pure water and tetramethylammonium hydroxide diluted to a predetermined concentration (in most processes, a mixture of 2.38 wt % tetramethylammonium hydroxide and 97.62 wt % water is used), and even in the extreme-ultraviolet lithography process, the developer that is currently used includes pure water and diluted tetramethylammonium hydroxide.

Pattern collapse is observed when rinsing with pure water alone continuously after development during the extreme-ultraviolet lithography process, and pattern collapse is also observed when a processing solution including pure water and tetramethylammonium hydroxide is applied continuously after development or is applied continuously after the use of pure water.

Moreover, it is presumed that, in the case of the processing solution including tetramethylammonium hydroxide, the pattern is destroyed due to weakening of the fine pattern exposed to extreme ultraviolet rays and due to large or uneven capillary force.

Therefore, in order to reduce collapse of the pattern exposed to extreme ultraviolet rays and also to reduce the LWR (line width roughness) and the number of defects in the photoresist pattern in the extreme-ultraviolet process, it is necessary to search for an alkaline material that has less influence on the exposed pattern than tetramethylammonium hydroxide.

In the present disclosure, it is confirmed that, when using tetraethylammonium hydroxide, tetrapropylammonium hydroxide, or tetrabutylammonium hydroxide, among alkaline materials, pattern collapse is avoided and LWR and the incidence of defects are reduced.

A preferred first embodiment of the present disclosure provides a processing solution for reducing the incidence of photoresist pattern collapse and the number of defects during development of a photoresist, including 0.0001 to 1 wt % of an anionic surfactant, 0.0001 to 1 wt % of an alkaline material, and 98 to 99.9998 wt % of water.

Here, the anionic surfactant may be selected from the group consisting of a polycarboxylic acid salt, a sulfonic acid salt, a sulfuric acid ester salt, a phosphoric acid ester salt, and mixtures thereof.

Here, the alkaline material may be selected from the group consisting of tetraethylammonium hydroxide, tetrapropylammonium hydroxide, tetrabutylammonium hydroxide, and mixtures thereof.

In addition, the present disclosure provides a method of forming a photoresist pattern, including (a) forming a photoresist film by applying a photoresist on a semiconductor substrate, (b) forming a photoresist pattern by exposing and developing the photoresist film, and (c) cleaning the photoresist pattern with the processing solution composition for reducing the incidence of pattern collapse and the number of defects.

The cause of pattern collapse is deemed to be due to the capillary force generated between patterns when the pattern is cleaned with pure water after development, but it has been found empirically that pattern collapse cannot be completely prevented and that the number of defects cannot be reduced even when the capillary force is decreased.

In order to reduce the capillary force, in the case in which an inappropriate surfactant is excessively used for the purpose of lowering the surface tension of the processing solution, melting of the pattern may be induced, which may lead to further collapse of the pattern or may increase the number of defects.

In order to reduce the incidence of pattern collapse and the number of defects, it is important to select a surfactant that not only reduces the surface tension of the processing solution but also prevents melting of the photoresist pattern.

The processing solution of the present disclosure exhibits an excellent effect on a photoresist using an extreme-ultraviolet light source. In particular, there is an effect of reducing the incidence of pattern collapse and the number of defects during development of a photoresist in which the resin, which is the main component of the photoresist, is polyhydroxystyrene.

Advantageous Effects

According to the present disclosure, a processing solution has the effect of reducing the incidence of pattern collapse and the number of defects, which cannot be achieved with a photoresist alone, when forming a pattern using an extreme-ultraviolet light source. In particular, a method of forming a photoresist pattern including a cleaning process using such a processing solution is capable of exhibiting an effect of greatly reducing production costs.

BEST MODE

Hereinafter, a detailed description will be given of the present disclosure.

The present disclosure, which is the culmination of extensive long-term study, pertains to a processing solution for reducing the incidence of photoresist pattern collapse and the number of defects, including 0.0001 to 1 wt % of an alkaline material selected from the group consisting of tetraethylammonium hydroxide, tetrapropylammonium hydroxide, tetrabutylammonium hydroxide, and mixtures thereof, 0.0001 to 1 wt % of an anionic surfactant selected from the group consisting of a polycarboxylic acid salt, a sulfonic acid salt, a sulfuric acid ester salt, a phosphoric acid ester salt, and mixtures thereof, and 98 to 99.9998 wt % of water. The components and amounts of the processing solution of the present disclosure were set according to Example 1 to Example 40, and the components and amounts for comparison therewith were set according to Comparative Example 1 to Comparative Example 22.

Preferred examples of the present disclosure and comparative examples for comparison therewith are described below. However, the following examples are merely a preferred embodiment of the present disclosure, and the present disclosure is not limited to the following examples.

Mode for Disclosure

Example 1

A processing solution for reducing the incidence of collapse of a photoresist pattern, including 0.0001 wt % of a polycarboxylic acid ammonium salt and 0.01 wt % of tetrabutylammonium hydroxide, was prepared as follows.

0.0001 wt % of a polycarboxylic acid ammonium salt and 0.01 wt % of tetrabutylammonium hydroxide were added to a balance of distilled water, stirred for 5 hours, and passed through a 0.01 µm filter to remove fine solid impurities, thereby preparing a processing solution for reducing the incidence of collapse of a photoresist pattern.

Example 2 to Example 40

Respective processing solutions for reducing the number of defects of a photoresist pattern were prepared in the same manner as in Example 1 using components in the amounts shown in Tables 1 to 12 below.

Comparative Example 1

Distilled water, which is typically used as the final cleaning solution in a development process during manufacture of a semiconductor device, was prepared.

Comparative Example 2 to Comparative Example 22

For comparison with Examples, respective processing solutions were prepared in the same manner as in Example 1 using components in the amounts shown in Tables 1 to 12 below.

Test Example 1 to Test Example 40 and Comparative Test Example 1 to Comparative Test Example 22

The incidence of pattern collapse and the defect number reduction ratio in a silicon wafer having a pattern in each of Example 1 to Example 40 and Comparative Example 1 to Comparative Example 22 were measured. The results thereof are shown as Test Example 1 to Test Example 40 and Comparative Test Example 1 to Comparative Test Example 22 in Tables 13 and 14 below.

(1) Prevention of Pattern Collapse

After exposure and focus splitting, the number of blocks in which the pattern did not collapse, out of the total of 89 blocks, was measured using a critical dimension scanning electron microscope (CD-SEM, Hitachi).

(2) Defect Number Reduction Ratio

For the photoresist pattern rinsed with each processing solution sample using a surface defect observation device [KLA, Tencor], the number of defects (A) was measured and expressed as a percentage (%) of the number of defects (B) observed upon rinsing with pure water alone, that is, (A/B)×100.

The number of defects after treatment with pure water alone was set to 100% as a standard, and the extent of decrease (improvement) or increase (aggravation) compared to the number of defects when treated with pure water alone was expressed as a reduction ratio.

(3) Transparency

The transparency of the prepared processing solution was observed with the naked eye and classified as transparent or opaque.

TABLE 1

|  | Surfactant | | Alkaline material | | Distilled water | |
| --- | --- | --- | --- | --- | --- | --- |
|  | Name | Amount (wt %) | Name | Amount (wt %) | Name | Amount (wt %) |
| Example 1 | Polycarboxylic acid ammonium salt | 0.0001 | Tetrabutylammonium hydroxide | 0.01 | Distilled water | 99.9899 |
| Example 2 | Polycarboxylic acid ammonium salt | 0.001 | Tetrabutylammonium hydroxide | 0.01 | Distilled water | 99.9890 |
| Example 3 | Polycarboxylic acid ammonium salt | 0.01 | Tetrabutylammonium hydroxide | 0.01 | Distilled water | 99.9800 |
| Example 4 | Polycarboxylic acid ammonium salt | 0.1 | Tetrabutylammonium hydroxide | 0.01 | Distilled water | 99.8900 |
| Example 5 | Polycarboxylic acid ammonium salt | 1 | Tetrabutylammonium hydroxide | 0.01 | Distilled water | 98.9900 |
| Comparative Example 1 | — | — | — | — | Distilled water | 100 |
| Comparative Example 2 | — | — | Tetrabutylammonium hydroxide | 0.01 | Distilled water | 99.9900 |
| Comparative Example 3 | Polycarboxylic acid ammonium salt | 2 | Tetrabutylammonium hydroxide | 0.01 | Distilled water | 97.9900 |

TABLE 2

|  | Surfactant | | Alkaline material | | Distilled water | |
| --- | --- | --- | --- | --- | --- | --- |
|  | Name | Amount (wt %) | Name | Amount (wt %) | Name | Amount (wt %) |
| Example 6 | Sulfonic acid salt | 0.0001 | Tetrabutylammonium hydroxide | 0.01 | Distilled water | 99.9899 |
| Example 7 | Sulfonic acid salt | 0.001 | Tetrabutylammonium hydroxide | 0.01 | Distilled water | 99.9890 |
| Example 8 | Sulfonic acid salt | 0.01 | Tetrabutylammonium hydroxide | 0.01 | Distilled water | 99.9800 |
| Example 9 | Sulfonic acid salt | 0.1 | Tetrabutylammonium hydroxide | 0.01 | Distilled water | 99.8900 |
| Example 10 | Sulfonic acid salt | 1 | Tetrabutylammonium hydroxide | 0.01 | Distilled water | 98.9900 |
| Comparative Example 1 | — | — | — | — | Distilled water | 100 |
| Comparative Example 2 | — | — | Tetrabutylammonium hydroxide | 0.01 | Distilled water | 99.9900 |
| Comparative Example 4 | Sulfonic acid salt | 2 | Tetrabutylammonium hydroxide | 0.01 | Distilled water | 97.9900 |

TABLE 3

|  | Surfactant | | Alkaline material | | Distilled water | |
| --- | --- | --- | --- | --- | --- | --- |
|  | Name | Amount (wt %) | Name | Amount (wt %) | Name | Amount (wt %) |
| Example 11 | Sulfuric acid ester salt | 0.0001 | Tetrabutylammonium hydroxide | 0.01 | Distilled water | 99.9899 |
| Example 12 | Sulfuric acid ester salt | 0.001 | Tetrabutylammonium hydroxide | 0.01 | Distilled water | 99.9890 |
| Example 13 | Sulfuric acid ester salt | 0.01 | Tetrabutylammonium hydroxide | 0.01 | Distilled water | 99.9800 |
| Example 14 | Sulfuric acid ester salt | 0.1 | Tetrabutylammonium hydroxide | 0.01 | Distilled water | 99.8900 |
| Example 15 | Sulfuric acid ester salt | 1 | Tetrabutylammonium hydroxide | 0.01 | Distilled water | 98.9900 |
| Comparative Example 1 | — | — | — | — | Distilled water | 100 |
| Comparative Example 2 | — | — | Tetrabutylammonium hydroxide | 0.01 | Distilled water | 99.9900 |
| Comparative Example 5 | Sulfuric acid ester salt | 2 | Tetrabutylammonium hydroxide | 0.01 | Distilled water | 97.9900 |

TABLE 4

| | Surfactant | | Alkaline material | | Distilled water | |
|---|---|---|---|---|---|---|
| | Name | Amount (wt %) | Name | Amount (wt %) | Name | Amount (wt %) |
| Example 16 | Phosphoric acid ester salt | 0.0001 | Tetrabutylammonium hydroxide | 0.01 | Distilled water | 99.9899 |
| Example 17 | Phosphoric acid ester salt | 0.001 | Tetrabutylammonium hydroxide | 0.01 | Distilled water | 99.9890 |
| Example 18 | Phosphoric acid ester salt | 0.01 | Tetrabutylammonium hydroxide | 0.01 | Distilled water | 99.9800 |
| Example 19 | Phosphoric acid ester salt | 0.1 | Tetrabutylammonium hydroxide | 0.01 | Distilled water | 99.8900 |
| Example 20 | Phosphoric acid ester salt | 1 | Tetrabutylammonium hydroxide | 0.01 | Distilled water | 98.9900 |
| Comparative Example 1 | — | — | — | — | Distilled water | 100 |
| Comparative Example 2 | — | — | Tetrabutylammonium hydroxide | 0.01 | Distilled water | 99.9900 |
| Comparative Example 6 | Phosphoric acid ester salt | 2 | Tetrabutylammonium hydroxide | 0.01 | Distilled water | 97.9900 |

TABLE 5

| | Surfactant | | Alkaline material | | Distilled water | |
|---|---|---|---|---|---|---|
| | Name | Amount (wt %) | Name | Amount (wt %) | Name | Amount (wt %) |
| Example 21 | Polycarboxylic acid ammonium salt | 0.01 | Tetrabutylammonium hydroxide | 0.0001 | Distilled water | 99.9899 |
| Example 22 | Polycarboxylic acid ammonium salt | 0.01 | Tetrabutylammonium hydroxide | 0.001 | Distilled water | 99.9890 |
| Example 3 | Polycarboxylic acid ammonium salt | 0.01 | Tetrabutylammonium hydroxide | 0.01 | Distilled water | 99.9800 |
| Example 23 | Polycarboxylic acid ammonium salt | 0.01 | Tetrabutylammonium hydroxide | 0.1 | Distilled water | 99.8900 |
| Example 24 | Polycarboxylic acid ammonium salt | 0.01 | Tetrabutylammonium hydroxide | 1 | Distilled water | 98.9900 |
| Comparative Example 7 | Polycarboxylic acid ammonium salt | 0.01 | — | — | Distilled water | 99.9900 |
| Comparative Example 8 | Polycarboxylic acid ammonium salt | 0.01 | Tetrabutylammonium hydroxide | 2 | Distilled water | 97.9900 |

TABLE 6

| | Surfactant | | Alkaline material | | Distilled water | |
|---|---|---|---|---|---|---|
| | Name | Amount (wt %) | Name | Amount (wt %) | Name | Amount (wt %) |
| Example 25 | Sulfonic acid salt | 0.01 | Tetrabutylammonium hydroxide | 0.0001 | Distilled water | 99.9899 |
| Example 26 | Sulfonic acid salt | 0.01 | Tetrabutylammonium hydroxide | 0.001 | Distilled water | 99.9890 |
| Example 8 | Sulfonic acid salt | 0.01 | Tetrabutylammonium hydroxide | 0.01 | Distilled water | 99.9800 |
| Example 27 | Sulfonic acid salt | 0.01 | Tetrabutylammonium hydroxide | 0.1 | Distilled water | 99.8900 |
| Example 28 | Sulfonic acid salt | 0.01 | Tetrabutylammonium hydroxide | 1 | Distilled water | 98.9900 |
| Comparative Example 9 | Sulfonic acid salt | 0.01 | — | — | Distilled water | 99.9900 |
| Comparative Example 10 | Sulfonic acid salt | 0.01 | Tetrabutylammonium hydroxide | 2 | Distilled water | 97.9900 |

TABLE 7

| | Surfactant | | Alkaline material | | Distilled water | |
|---|---|---|---|---|---|---|
| | Name | Amount (wt %) | Name | Amount (wt %) | Name | Amount (wt %) |
| Example 29 | Sulfuric acid ester salt | 0.01 | Tetrabutylammonium hydroxide | 0.0001 | Distilled water | 99.9899 |
| Example 30 | Sulfuric acid ester salt | 0.01 | Tetrabutylammonium hydroxide | 0.001 | Distilled water | 99.9890 |
| Example 13 | Sulfuric acid ester salt | 0.01 | Tetrabutylammonium hydroxide | 0.01 | Distilled water | 99.9800 |
| Example 31 | Sulfuric acid ester salt | 0.01 | Tetrabutylammonium hydroxide | 0.1 | Distilled water | 99.8900 |
| Example 32 | Sulfuric acid ester salt | 0.01 | Tetrabutylammonium hydroxide | 1 | Distilled water | 98.9900 |
| Comparative Example 11 | Sulfuric acid ester salt | 0.01 | — | — | Distilled water | 99.9900 |
| Comparative Example 12 | Sulfuric acid ester salt | 0.01 | Tetrabutylammonium hydroxide | 2 | Distilled water | 97.9900 |

TABLE 8

| | Surfactant | | Alkaline material | | Distilled water | |
|---|---|---|---|---|---|---|
| | Name | Amount (wt %) | Name | Amount (wt %) | Name | Amount (wt %) |
| Example 33 | Phosphoric acid ester salt | 0.01 | Tetrabutylammonium hydroxide | 0.0001 | Distilled water | 99.9899 |
| Example 34 | Phosphoric acid ester salt | 0.01 | Tetrabutylammonium hydroxide | 0.001 | Distilled water | 99.9890 |
| Example 18 | Phosphoric acid ester salt | 0.01 | Tetrabutylammonium hydroxide | 0.01 | Distilled water | 99.9800 |
| Example 35 | Phosphoric acid ester salt | 0.01 | Tetrabutylammonium hydroxide | 0.1 | Distilled water | 99.8900 |
| Example 36 | Phosphoric acid ester salt | 0.01 | Tetrabutylammonium hydroxide | 1 | Distilled water | 98.9900 |
| Comparative Example 13 | Phosphoric acid ester salt | 0.01 | — | — | Distilled water | 99.9900 |
| Comparative Example 14 | Phosphoric acid ester salt | 0.01 | Tetrabutylammonium hydroxide | 2 | Distilled water | 97.9900 |

TABLE 9

| | Surfactant | | Alkaline material | | Distilled water | |
|---|---|---|---|---|---|---|
| | Name | Amount (wt %) | Name | Amount (wt %) | Name | Amount (wt %) |
| Example 3 | Polycarboxylic acid ammonium salt | 0.01 | Tetrabutylammonium hydroxide | 0.01 | Distilled water | 99.9800 |
| Example 37 | Polycarboxylic acid ammonium salt | 0.01 | Tetrabutylammonium hydroxide | 0.01 | Distilled water | 99.9800 |
| Comparative Example 15 | Polycarboxylic acid ammonium salt | 0.01 | Tetrabutylammonium hydroxide | 0.01 | Distilled water | 99.9800 |
| Comparative Example 16 | Polycarboxylic acid ammonium salt | 0.01 | Tetrabutylammonium hydroxide | 0.01 | Distilled water | 99.9800 |

TABLE 10

| | Surfactant | | Alkaline material | | Distilled water | |
|---|---|---|---|---|---|---|
| | Amount (wt %) | Name | Amount (wt %) | Name | Amount (wt %) | Amount (wt %) |
| Example 8 | Sulfonic acid salt | 0.01 | Tetrabutylammonium hydroxide | 0.01 | Distilled water | 99.9800 |
| Example 38 | Sulfonic acid salt | 0.01 | Tetrabutylammonium hydroxide | 0.01 | Distilled water | 99.9800 |
| Comparative Example 17 | Sulfonic acid salt | 0.01 | Tetrabutylammonium hydroxide | 0.01 | Distilled water | 99.9800 |
| Comparative Example 18 | Sulfonic acid salt | 0.01 | Tetrabutylammonium hydroxide | 0.01 | Distilled water | 99.9800 |

TABLE 11

| | Surfactant | | Alkaline material | | Distilled water | |
|---|---|---|---|---|---|---|
| | Amount (wt %) | Name | Amount (wt %) | Name | Amount (wt %) | Amount (wt %) |
| Example 13 | Sulfuric acid ester salt | 0.01 | Tetrabutylammonium hydroxide | 0.01 | Distilled water | 99.9800 |
| Example 39 | Sulfuric acid ester salt | 0.01 | Tetrabutylammonium hydroxide | 0.01 | Distilled water | 99.9800 |
| Comparative Example 19 | Sulfuric acid ester salt | 0.01 | Tetrabutylammonium hydroxide | 0.01 | Distilled water | 99.9800 |
| Comparative Example 20 | Sulfuric acid ester salt | 0.01 | Tetrabutylammonium hydroxide | 0.01 | Distilled water | 99.9800 |

TABLE 12

| | Surfactant | | Alkaline material | | Distilled water | |
|---|---|---|---|---|---|---|
| | Amount (wt %) | Name | Amount (wt %) | Name | Amount (wt %) | Amount (wt %) |
| Example 18 | Phosphoric acid ester salt | 0.01 | Tetrabutylammonium hydroxide | 0.01 | Distilled water | 99.9800 |
| Example 40 | Phosphoric acid ester salt | 0.01 | Tetrabutylammonium hydroxide | 0.01 | Distilled water | 99.9800 |
| Comparative Example 21 | Phosphoric acid ester salt | 0.01 | Tetrabutylammonium hydroxide | 0.01 | Distilled water | 99.9800 |
| Comparative Example 22 | Phosphoric acid ester salt | 0.01 | Tetrabutylammonium hydroxide | 0.01 | Distilled water | 99.9800 |

Test Example 1 to Test Example 40 and Comparative Test Example 1 to Comparative Test Example 22

The incidence of pattern collapse, the defect number reduction ratio, and transparency in a silicon wafer having a pattern in each of Example 1 to Example 40 and Comparative Example 1 to Comparative Example 22 were measured. The results thereof are shown as Test Example 1 to Test Example 40 and Comparative Test Example 1 to Comparative Test Example 22 in Tables 13 and 14 below.

(1) Incidence of Pattern Collapse

After exposure and focus splitting, the number of blocks in which the pattern did not collapse, out of the total of 89 blocks, was measured using a critical dimension scanning electron microscope (CD-SEM, Hitachi).

(2) Defect Number Ratio

For the photoresist pattern rinsed with each processing solution sample using a surface defect observation device [KLA, Tencor], the number of defects (A) was measured and expressed as a percentage (%) of the number of defects (B) observed upon rinsing with pure water alone, that is, (A/B)×100.

(3) Transparency

The transparency of the prepared processing solution was observed with the naked eye and classified as transparent or opaque.

TABLE 13

| | Number of blocks not exhibiting pattern collapse | Defect number reduction ratio (%) | Transparency |
|---|---|---|---|
| Test Example 1 | 55 | 53 | Transparent |
| Test Example 2 | 63 | 46 | Transparent |
| Test Example 3 | 81 | 25 | Transparent |

TABLE 13-continued

| | Number of blocks not exhibiting pattern collapse | Defect number reduction ratio (%) | Transparency |
|---|---|---|---|
| Test Example 4 | 64 | 35 | Transparent |
| Test Example 5 | 68 | 80 | Transparent |
| Test Example 6 | 53 | 52 | Transparent |
| Test Example 7 | 61 | 48 | Transparent |
| Test Example 8 | 76 | 30 | Transparent |
| Test Example 9 | 65 | 36 | Transparent |
| Test Example 10 | 67 | 75 | Transparent |
| Test Example 11 | 52 | 56 | Transparent |
| Test Example 12 | 64 | 47 | Transparent |
| Test Example 13 | 75 | 31 | Transparent |
| Test Example 14 | 62 | 38 | Transparent |
| Test Example 15 | 66 | 72 | Transparent |
| Test Example 16 | 52 | 56 | Transparent |
| Test Example 17 | 68 | 50 | Transparent |
| Test Example 18 | 76 | 33 | Transparent |
| Test Example 19 | 65 | 38 | Transparent |
| Test Example 20 | 69 | 78 | Transparent |
| Test Example 21 | 70 | 81 | Transparent |
| Test Example 22 | 72 | 53 | Transparent |
| Test Example 23 | 75 | 38 | Transparent |
| Test Example 24 | 66 | 84 | Transparent |
| Test Example 25 | 69 | 80 | Transparent |
| Test Example 26 | 70 | 52 | Transparent |
| Test Example 27 | 71 | 40 | Transparent |
| Test Example 28 | 65 | 87 | Transparent |
| Test Example 29 | 72 | 76 | Transparent |
| Test Example 30 | 70 | 50 | Transparent |
| Test Example 31 | 76 | 37 | Transparent |
| Test Example 32 | 68 | 88 | Transparent |
| Test Example 33 | 67 | 80 | Transparent |
| Test Example 34 | 71 | 52 | Transparent |
| Test Example 35 | 72 | 40 | Transparent |
| Test Example 36 | 66 | 86 | Transparent |
| Test Example 37 | 57 | 69 | Transparent |
| Test Example 38 | 59 | 70 | Transparent |
| Test Example 39 | 55 | 71 | Transparent |
| Test Example 40 | 60 | 65 | Transparent |

TABLE 14

| | Number of blocks not exhibiting pattern collapse | Defect number reduction ratio (%) | Transparency |
|---|---|---|---|
| Comparative Test Example 1 | 46 | 100 | Transparent |
| Comparative Test Example 2 | 40 | 95 | Transparent |
| Comparative Test Example 3 | 37 | 276 | Opaque |
| Comparative Test Example 4 | 38 | 269 | Opaque |
| Comparative Test Example 5 | 36 | 274 | Opaque |
| Comparative Test Example 6 | 35 | 281 | Opaque |
| Comparative Test Example 7 | 58 | 127 | Transparent |
| Comparative Test Example 8 | 41 | 157 | Transparent |
| Comparative Test Example 9 | 59 | 129 | Transparent |
| Comparative Test Example 10 | 39 | 160 | Transparent |
| Comparative Test Example 11 | 57 | 124 | Transparent |
| Comparative Test Example 12 | 40 | 159 | Transparent |
| Comparative Test Example 13 | 59 | 120 | Transparent |
| Comparative Test Example 14 | 42 | 151 | Transparent |
| Comparative Test Example 15 | 52 | 142 | Transparent |
| Comparative Test Example 16 | 50 | 99 | Transparent |
| Comparative Test Example 17 | 49 | 140 | Transparent |
| Comparative Test Example 18 | 51 | 101 | Transparent |
| Comparative Test Example 19 | 54 | 138 | Transparent |
| Comparative Test Example 20 | 49 | 97 | Transparent |
| Comparative Test Example 21 | 53 | 151 | Transparent |
| Comparative Test Example 22 | 50 | 98 | Transparent |

Based on the results of comparison of Test Example 1 to Test Example 40 with Comparative Test Example 1 to Comparative Test Example 22, when the number of blocks not exhibiting pattern collapse was 50 or more and the defect number reduction ratio was 90% or less relative to Comparative Test Example 1, results were considered to be superior.

In the processing solutions according to Test Example 1 to Test Example 40, including 0.0001 to 1 wt % of the anionic surfactant selected from among a polycarboxylic acid salt, a sulfonic acid salt, a sulfuric acid ester salt, and a phosphoric acid ester salt, 0.0001 to 1 wt % of the alkaline material selected from among tetraethylammonium hydroxide, tetrapropylammonium hydroxide, and tetrabutylammonium hydroxide, and 98 to 99.9998 wt % of water, the incidence of pattern collapse was reduced and the number of defects was also reduced, compared to Comparative Test Example 1 to Comparative Test Example 22.

In particular, Test Examples 2 to 4, Test Examples 7 to 9, Test Examples 12 to 14, Test Examples 17 to 19, Test Examples 22 and 23, Test Examples 26 and 27, Test Examples 30 and 31, and Test Examples 34 and 35 exhibited more preferable results.

Specifically, the processing solution for reducing the incidence of photoresist pattern collapse and the number of defects according to each of Test Examples 2 to 4, Test Examples 7 to 9, Test Examples 12 to 14, Test Examples 17 to 19, Test Examples 22 and 23, Test Examples 26 and 27, Test Examples 30 and 31, and Test Examples 34 and 35, including 0.001 to 0.1 wt % of the anionic surfactant selected from among a polycarboxylic acid salt, a sulfonic acid salt, a sulfuric acid ester salt, and a phosphoric acid ester salt, 0.001 to 0.1 wt % of the alkaline material selected from among tetraethylammonium hydroxide, tetrapropylammonium hydroxide, and tetrabutylammonium hydroxide, and 99.8 to 99.998 wt % of water, was confirmed to exhibit reduced pattern collapse and a reduced number of defects compared to Comparative Test Examples and other Test Examples, indicating that the above concentration ranges are more preferable.

Based on the result of evaluation of the incidence of photoresist pattern collapse according to Example 3, the number of blocks not exhibiting pattern collapse was measured to be 81.

Based on the result of evaluation of the incidence of photoresist pattern collapse according to Comparative Test Example 1, the number of blocks not exhibiting pattern collapse was measured to be 46.

Although specific embodiments of the present disclosure have been disclosed in detail above, it will be obvious to those skilled in the art that the description is merely of preferable exemplary embodiments and is not to be construed to limit the scope of the present disclosure. Therefore, the substantial scope of the present disclosure will be defined by the appended claims and equivalents thereof.

The invention claimed is:

1. A processing solution for reducing incidence of pattern collapse and a number of defects in a photoresist pattern comprising polyhydroxystyrene during photoresist patterning using extreme ultraviolet rays as a light source, the processing solution consisting of:
   0.001 to 0.1 wt % of an anionic surfactant selected from the group consisting of a polycarboxylic acid salt, a sulfonic acid salt, a sulfuric acid ester salt, and mixtures thereof;
   0.001 to 0.1 wt % of an alkaline material selected from the group consisting of tetraethylammonium hydroxide, tetrapropylammonium hydroxide, tetrabutylammonium hydroxide, and mixtures thereof; and
   99.8 to 99.998 wt % of water.

2. The processing solution of claim 1, wherein the anionic surfactant is a polycarboxylic acid salt.

3. A method of forming a photoresist pattern, comprising:
   (a) forming a photoresist film by applying a photoresist on a semiconductor substrate;
   (b) forming a photoresist pattern by exposing the photoresist film to extreme ultraviolet rays and then performing development; and
   (c) cleaning the photoresist pattern with the processing solution of claim 2.

4. The processing solution of claim 1, wherein the anionic surfactant is a sulfonic acid salt.

5. A method of forming a photoresist pattern, comprising:
   (a) forming a photoresist film by applying a photoresist on a semiconductor substrate;
   (b) forming a photoresist pattern by exposing the photoresist film to extreme ultraviolet rays and then performing development; and
   (c) cleaning the photoresist pattern with the processing solution of claim 4.

6. The processing solution of claim 1, wherein the anionic surfactant is a sulfuric acid ester salt.

7. A method of forming a photoresist pattern, comprising:
   (a) forming a photoresist film by applying a photoresist on a semiconductor substrate;
   (b) forming a photoresist pattern by exposing the photoresist film to extreme ultraviolet rays and then performing development; and
   (c) cleaning the photoresist pattern with the processing solution of claim 6.

8. The processing solution of claim 1, wherein the alkaline material is selected from the group consisting of tetraethylammonium hydroxide, tetrabutylammonium hydroxide, and mixtures thereof.

9. The processing solution of claim 8, wherein the alkaline material is tetraethylammonium hydroxide.

10. A method of forming a photoresist pattern, comprising:
    (a) forming a photoresist film by applying a photoresist on a semiconductor substrate;
    (b) forming a photoresist pattern by exposing the photoresist film to extreme ultraviolet rays and then performing development; and
    (c) cleaning the photoresist pattern with the processing solution of claim 9.

11. The processing solution of claim 8, wherein the alkaline material is tetrabutylammonium hydroxide.

12. A method of forming a photoresist pattern, comprising:
    (a) forming a photoresist film by applying a photoresist on a semiconductor substrate;
    (b) forming a photoresist pattern by exposing the photoresist film to extreme ultraviolet rays and then performing development; and
    (c) cleaning the photoresist pattern with the processing solution of claim 11.

13. A method of forming a photoresist pattern, comprising:
    (a) forming a photoresist film by applying a photoresist on a semiconductor substrate;
    (b) forming a photoresist pattern by exposing the photoresist film to extreme ultraviolet rays and then performing development; and
    (c) cleaning the photoresist pattern with the processing solution of claim 8.

14. A method of forming a photoresist pattern, comprising:
    (a) forming a photoresist film by applying a photoresist on a semiconductor substrate;
    (b) forming a photoresist pattern by exposing the photoresist film to extreme ultraviolet rays and then performing development; and
    (c) cleaning the photoresist pattern with the processing solution of claim 1.

* * * * *